(12) United States Patent
Zhou et al.

(10) Patent No.: US 9,116,211 B2
(45) Date of Patent: Aug. 25, 2015

(54) DEVICE AND METHOD FOR DETECTING STATE OF OVERLOAD AND OVERCURRENT PROTECTOR

(75) Inventors: Baohang Zhou, Shenzhen (CN); Yanni Meng, Shenzhen (CN); Mingming Liu, Shenzhen (CN); Lin Li, Shenzhen (CN); Lingqiao Teng, Shenzhen (CN); Shuwang Wei, Shenzhen (CN); Hui Rong, Shenzhen (CN)

(73) Assignee: ZTE CORPORATION, Shenzhen, Guangdong Province (CN)

( * ) Notice: Subject to any disclaimer, the term of this patent is extended or adjusted under 35 U.S.C. 154(b) by 123 days.

(21) Appl. No.: 13/983,824

(22) PCT Filed: Aug. 30, 2011

(86) PCT No.: PCT/CN2011/079119
§ 371 (c)(1),
(2), (4) Date: Aug. 6, 2013

(87) PCT Pub. No.: WO2012/106953
PCT Pub. Date: Aug. 16, 2012

(65) Prior Publication Data
US 2013/0314100 A1    Nov. 28, 2013

(30) Foreign Application Priority Data

Feb. 12, 2011  (CN) .......................... 2011 1 0037085

(51) Int. Cl.
*G01R 31/00*   (2006.01)
*G01R 31/327*   (2006.01)

(52) U.S. Cl.
CPC .......... *G01R 31/327* (2013.01); *G01R 31/3277* (2013.01)

(58) Field of Classification Search
CPC .................................................. G01R 31/3277
USPC .................................................. 324/537, 424
See application file for complete search history.

(56) References Cited

U.S. PATENT DOCUMENTS

| 5,973,418 A | 10/1999 | Ciesielka et al. |
| 7,009,406 B2 * | 3/2006 | Naidu et al. ................. 324/536 |
| 2010/0019913 A1 | 1/2010 | Rodseth et al. |

FOREIGN PATENT DOCUMENTS

CN           2197775 Y      5/1995
(Continued)

OTHER PUBLICATIONS

International Search Report for PCT/CN2011/079119 dated Nov. 8, 2011.
(Continued)

*Primary Examiner* — Vincent Q Nguyen
(74) *Attorney, Agent, or Firm* — Ling Wu; Stephen Yang; Ling and Yang Intellectual Property (57) ABSTRACT

A device and method for detecting a state of a load overcurrent protector are disclosed. The above-mentioned device includes: an input module (22), configured to be connected with two ends of the load overcurrent protector, and generate two output signals respectively at two output ends thereof; a high level signal gating module (24), configured to receive the two output signals generated by the input module (22), and gate and output a high level signal according to the above-mentioned two output signals; a low level signal gating module (26), configured to receive the two output signals generated by the input module (22), and gate and output a low level signal according to the above-mentioned two output signals; and a detecting module (28), configured to detect a voltage difference between the above-mentioned high level signal and the low level signal.

9 Claims, 6 Drawing Sheets

(56) References Cited

FOREIGN PATENT DOCUMENTS

| | | |
|---|---|---|
| CN | 101005202 A | 7/2007 |
| CN | 201479113 U | 5/2010 |
| JP | 5019029 A | 1/1993 |

OTHER PUBLICATIONS

Peng, Junhong et al, Lightning Impulse Overvoltage Protection and Spd Detection for Electronic Equipment in Laboratory, Metrology & Measurement Technique, May 2010, vol. 37, No. 5, p. 14 to p. 15, ISSN 1004-6941.

* cited by examiner

DEVICE AND METHOD FOR DETECTING STATE OF OVERLOAD AND OVERCURRENT PROTECTOR

TECHNICAL FIELD

The present document relates to the communication field, and in particular, to a device and method for detecting a state of a load overcurrent protector.

BACKGROUND OF THE RELATED ART

The direct current (DC) communication power supply system is divided into the positive system and the negative system by different working grounds, the working ground in the positive system is a negative row (V−), while the working ground in the negative system is a positive row (V+); at present, generally all the 24V DC communication power supply systems are the positive systems, and all the 48V DC communication power supply system are mainly the negative systems.

In the DC communication power supply system, for the load output, the load overcurrent protector needs to be configured to perform the overcurrent or short circuit protection, and the choice for the load overcurrent protective devices are often the air switch, fuse wire, etc.; the state of the load overcurrent protector is critical for the maintenance of the communication power supply system, and is the essential detection content in the power supply system monitoring. When the state of the load overcurrent protector is detected, it needs to distinguish three kinds of states: 1. the conducting state of the load overcurrent protector, which is the normal running state; 2. the disconnected state of the load overcurrent protector with the load, which is an abnormal state; 3. the disconnected state of the load overcurrent protector without the load, which is a normal state.

Generally, the detection approaches of the state of the load overcurrent protector are mainly as follows: 1. the detection is performed by using the assisted dry contact; when the overcurrent protector is disconnected, the state of the assisted dry contact changes; detecting the state of the assisted dry contact refers to detecting the state of the current overcurrent protector. This approach can isolate the detection loop with the loop of the main load, and can be compatible with the positive and negative system at the same time; but this approach is unable to distinguish the disconnected state of the overcurrent protector without the load; and it needs the software to cooperate to prevent the false alarm. 2. when the fuse wire is disconnected, the detection circuit of the overcurrent protector is used to form a circuit loop, and the abnormal state (the disconnected state of the overcurrent protector with the load) is distinguished from other states to perform the detection. Generally, it is very difficult for this approach to be compatible with the positive and negative system.

SUMMARY OF THE INVENTION

The main object of the present document is to provide a device and method for detecting a state of a load overcurrent protector, at least to solve one of the above-mentioned problems.

According to one aspect of the present document, a device for detecting a state of a load overcurrent protector is provided, comprising: an input module, configured to be connected with two ends of the load overcurrent protector, and generate two output signals respectively at two output ends thereof; a high level signal gating module, configured to receive the two output signals generated by the input module, and gate and output a high level signal according to the two output signals; a low level signal gating module, configured to receive the two output signals generated by the input module and gate and output a low level signal according to the two output signals; and a detecting module, configured to detect a voltage difference between the high level signal and the low level signal.

The above-mentioned device further comprises: a high level signal generating module, configured to replace the high level signal gating module, receive the two output signals generated by the input module, and generate a high level signal according to the two output signals; and a low level signal generating module, configured to replace the low level signal gating module, receive the two output signals generated by the input module, and generate a low level signal according to the two output signals.

The high level signal gating module comprises a first branch and a second branch, wherein, the first branch comprises a first resistance (R1) and a first diode (VD1), the first resistance (R1) is connected to one output end of the input module, and a positive pole of the first diode (VD1) is connected to the first resistance (R1) in series; the second branch comprises a second resistance (R2) and a second diode (VD2), the second resistance (R2) is connected to another output end of the input module, and a positive pole of the second diode (VD2) is connected to the second resistance (R2) in series; and a negative pole of the first diode (VD1) and a negative pole of the second diode (VD2) are connected in parallel to one end of the detecting module; and the low level signal gating module comprises a third branch and a fourth branch, wherein, the third branch comprises a third resistance (R3) and a third diode (VD3), the third resistance (R3) is connected to one output end of the input module, and a negative pole of the third diode (VD3) is connected to the third resistance (R3) in series; the fourth branch comprises a fourth resistance (R4) and a fourth diode (VD4), the fourth resistance (R4) is connected to another output end of the input module, and a negative pole of the fourth diode (VD4) is connected to the fourth resistance (R4) in series; and a positive pole of the third diode (VD3) and a positive pole of the fourth diode (VD4) are connected in parallel to another end of the detecting module.

The high level signal gating module comprises a first resistance (R6), a second resistance (R7), a third resistance (R8), a fourth resistance (R9), a first PNP triode (T2), and a second PNP triode (T3), the first resistance (R6) and the third resistance (R8) are connected to the two output ends of the input module respectively, emitters of the first PNP triode (T2) and the second PNP triode (T3) are connected through the first resistance (R6) and the third resistance (R8), bases are connected directly and connected to the first resistance (R6) and the third resistance (R8), and collectors are connected to one end of the detecting module through the second resistance (R7) and the fourth resistance (R9) respectively; and the low level signal gating module comprises a first resistance (R10), a second resistance (R11), a third resistance (R12), a fourth resistance (R13), a first NPN triode (T4), and a second NPN triode (T5), the first resistance (R10) and the third resistance (R12) are connected to the two output ends of the input module respectively, emitters of the first NPN triode (T4) and the second NPN triode (T5) are connected through the first resistance (R10) and the third resistance (R12), bases are connected directly and connected to the first resistance (R10) and the third resistance (R12), and collectors are connected to another end of the detecting module through the second resistance (R11) and the fourth resistance (R13) respectively.

The high level signal generating module comprises a first resistance (R14), a second resistance (R15), a relay (K1), and a power supply (V1), one end of the first resistance (R14) is connected to one output end of the input module, and another end is connected to the relay (K1); one end of the relay (K1) is connected to one end of the first resistance (R14), and another end is connected to another output end of the input module; and a positive pole of the power supply (V1) is connected to one end of the detecting module through a contactor of the relay (K1) and the second resistance (R15); and the low level signal generating module comprises a first resistance (R16), a second resistance (R17), a relay (K2), and a power supply (V1), one end of the first resistance (R16) is connected to one output end of the input module, and another end is connected to the relay (K2); one end of the relay (K2) is connected to one end of the first resistance (R16), and another end is connected to another output end of the input module; and a negative pole of power supply (V1) is connected to another end of the detecting module through a contactor of the relay (K2) and the second resistance (R17).

The detecting module comprises: an analog-to-digital conversion unit, configured to, when there is a voltage difference between the high level signal and the low level signal, output a first predetermined value to indicate that the state of the load overcurrent protector is abnormal, and when there is no voltage difference between the high level signal and the low level signal, output a second predetermined value to indicate that the state of the load overcurrent protector is normal.

The analog-to-digital conversion unit comprises: a light emitting diode (LED1), a photosensitive triode (T1), and a resistance (R5), wherein, a positive pole of the light emitting diode (LED1) is connected to an output end of the high level signal gating module or the high level signal generating module, a negative pole of the light emitting diode (LED1) is connected to an output end of the low level signal gating module or the low level signal generating module, a base of the photosensitive triode (T1) is optically coupled with the light emitting diode, a collector of the photosensitive triode (T1) is connected to a circuit power supply (VCC), an emitter of the photosensitive triode (T1) is grounded through the resistance (R5), and an output end of the analog-to-digital conversion unit is led from the emitter of the photosensitive triode (T1).

According to another aspect of the present document, a method for detecting a state of a load overcurrent protector is provided, comprising: gathering level signals from two ends of the load overcurrent protector, and obtaining two level signals; gating the above-mentioned two level signals, and outputting a high level signal and a low level signal; and reflecting a working state of the load overcurrent protector by detecting whether there is a voltage difference between the above-mentioned high level signal and the low level signal.

A following step is used to replace the step of gating the two level signals and outputting a high level signal and a low level signal: generating a high level signal and a low level signal according to the gathered two level signals.

The step of reflecting a working state of the load overcurrent protector by detecting whether there is a voltage difference between the high level signal and the low level signal comprises: converting the voltage difference between the high level signal and the low level signal into a digital signal to be output through the analog-to-digital conversion, outputting a first predetermined value to indicate that a state of the load overcurrent protector is abnormal when there is a voltage difference, and outputting a second predetermined value to indicate that the state of the load overcurrent and protector is normal when there is no voltage difference.

With the present document, by adopting the scheme that the voltages of the two ends of the load overcurrent protector are gathered, further processing is performed on the two gathered voltages, a high level signal and a low level signal are gated and output through the high level signal gating module and the low level signal gating module, and the working state of the load overcurrent protector is indirectly reflected by detecting the voltage difference between the high level signal and the low level signal, the problem that, the state detection of the load overcurrent protector is unable to be compatible with the positive and negative system and requires the software cooperation in the related art, is solved, and then the effectiveness of distinguishing the normal state and abnormal state and realizing compatibility of the positive and negative systems is achieved without the need of participation of the software.

BRIEF DESCRIPTION OF DRAWINGS

The figures illustrated here is used to provide a further understanding for the present document, which constitutes a part of the present application, and the exemplary embodiments of the present document and the illustration thereof are used to explain the present document and will not constitute an inappropriate limit on the present document, wherein.

PREFERRED EMBODIMENTS OF THE INVENTION

The present document is described in detail with reference to the accompanying drawings and in combination with embodiments hereinafter. It should be illustrated that, in the case of not conflicting, the embodiments in the present application and features in these embodiments can be combined with each other.

Figure 1:
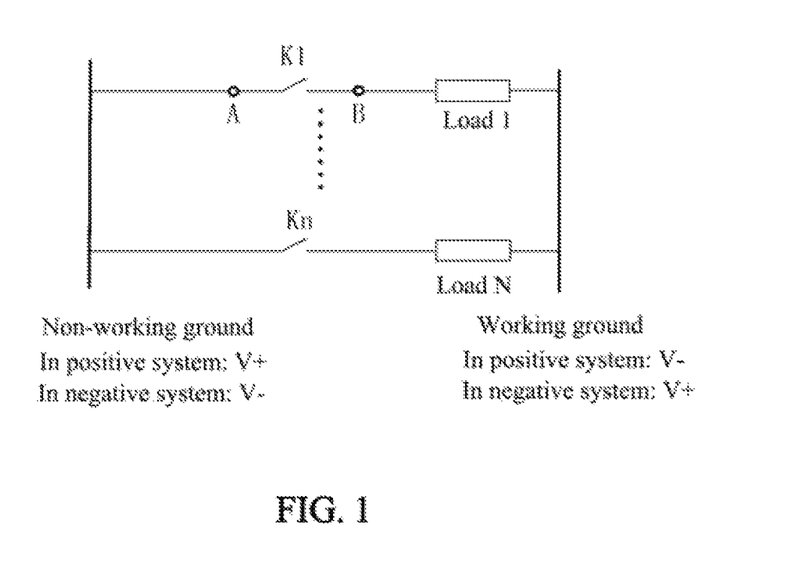
FIG. 1 is a schematic diagram of the power supply distribution of a DC power supply system according to the related art.

FIG. 1 is a power supply distribution diagram of a DC power supply system according to the related art. As shown in FIG. 1, when an overcurrent protective device is normal, voltages at point A and at point B are the same, and there is no voltage difference; while when the overcurrent protective device is disconnected, and there is a load supported by the power supply system, there is a voltage difference between the point A and the point B; only the voltage at the point A is greater than the voltage at the point B in a positive system, while in the negative system the voltage at the point B is greater than the voltage at the point A. In the present document, the voltage difference existed between the point A and the point B is used to detect the state of the overcurrent protective device, and meanwhile the positive and negative system is adapted by combining with the automatic selection or subsequent processing of the detection signal at the same time.

Figure 2:
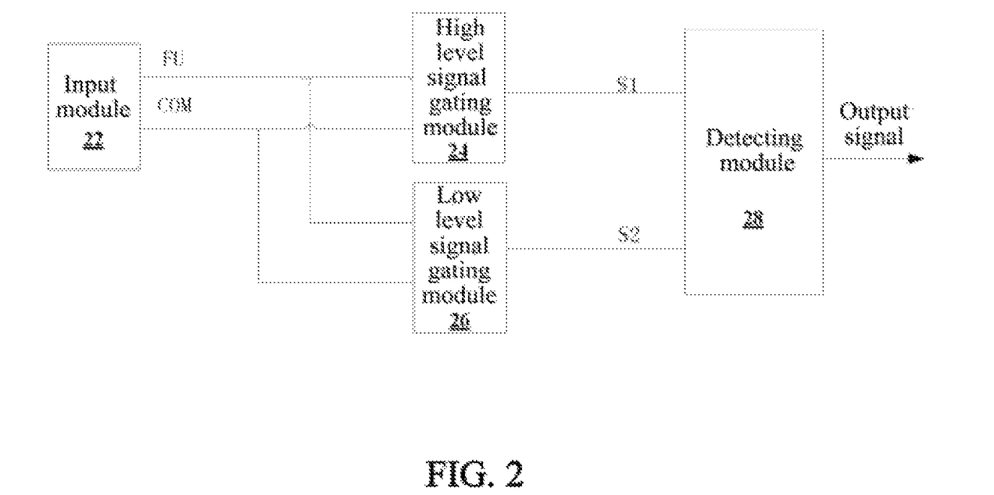
FIG. 2 is a structure block diagram of a device for detecting a state of a load overcurrent protector according to an embodiment of the present document.

FIG. 2 is a structure diagram of a device for detecting a state of a load overcurrent protector according to an embodiment of the present document. As shown in FIG. 2, the device for detecting the state of the load overcurrent protector according to the embodiment of the present document includes:

an input module 22, configured to be connected with two ends of the load overcurrent protector, and generate two output signals respectively at two output ends;

a high level signal gating module 24, connected to the input module 22, and configured to receive the two output signals generated by the input module and gate and output a high level signal according to the two output signals;

a low level signal gating module 26, connected to the input module 22, and configured to receive the two output signals generated by the input module and gate and output a low level signal according to the two output signals; and a detecting module 28, configured to detect a voltage difference between the high level signal and the low level signal.

The above-mentioned device further processes the gathered voltage value of two ends of the load overcurrent protector, gates and outputs a high level signal and a low level signal through the high level signal gating module 24 and the low level signal gating module 26, indirectly reflects the working state of the load overcurrent protector by detecting the voltage difference between the high level signal and the low level signal. The above-mentioned device is used to detect the state of the overcurrent protector, which can distinguish the abnormal state, and no matter in a positive system or a negative system, the outputs in the abnormal state are the same, so it is fully compatible with the positive and negative system without requiring the software cooperation.

In the above-mentioned device, the input module 22 is an interface connected to the power supply system, which can include two input detection lines connected to two ends of the load overcurrent protector respectively. The high level signal gating module 24 and the low level signal gating module 26 receive the signals from the input module 22 (FU and COM signals) as its input signals, and gate a group of output signals (S1 and S2), that is, one high level signal and one low level signal. The detecting module 28 receives these two signals S1 and S2, and detects the voltage difference between these two signals, to indirectly reflect the working state of the load overcurrent protector.

Figure 3:
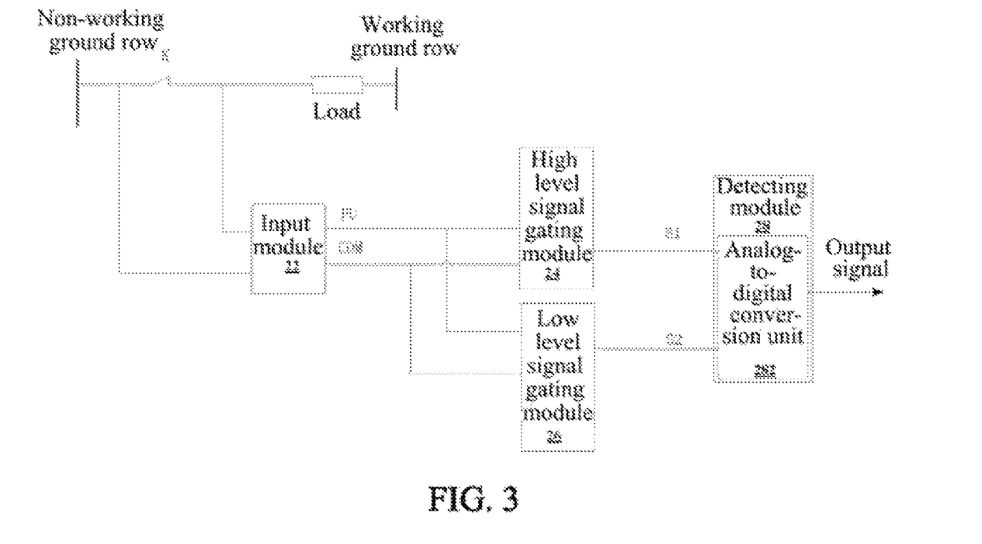
FIG. 3 is a structure block diagram of a device for detecting a state of a load overcurrent protector according to a preferable embodiment of the present document.
Figure 4:
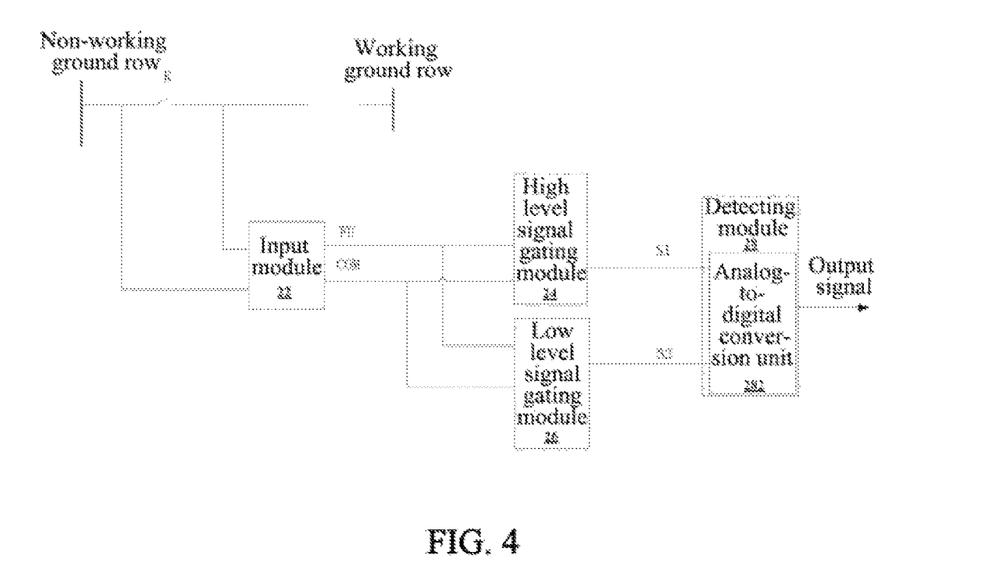
FIG. 4 is a schematic diagram of a detection principle when there is no load and the overcurrent protective device is disconnected according to a preferable embodiment of the present document.

When the load overcurrent protective device is in a normal state (the conducting state of the load overcurrent protector and the disconnected state of the load overcurrent protector without a load), as shown in FIG. 3 and FIG. 4, when there is no voltage difference between the FU and the COM signals, there is also no voltage difference between the signals S1 and S2 output by the signal gating or generating unit.

Figure 5:
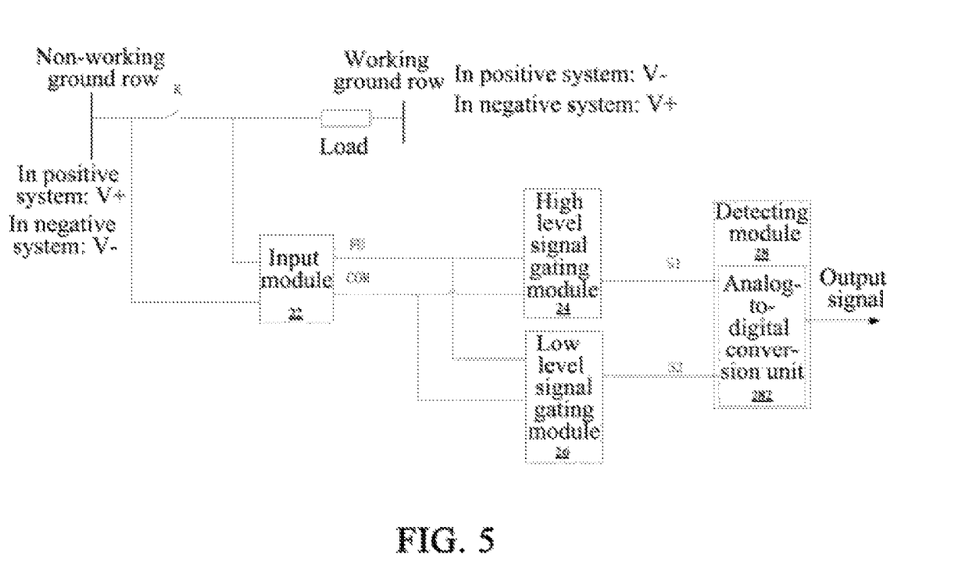
FIG. 5 is a schematic diagram of a detection principle when there is a load and the overcurrent protective device is disconnected according to a preferable embodiment of the present document.

When the load overcurrent protective device is in an abnormal state (the disconnected state of the load overcurrent protector with a load), as shown in FIG. 5, the COM signal is connected to the non-working ground, the FU signal is connected to the working ground through the load, and there is a voltage difference between the FU and the COM signals at this moment (the difference is negative in the positive system, and the difference is positive in the negative system); if the signal module 24 outputs the signal, i.e., it will output a high level signal S1 and a low level signal S2, and there is a positive voltage difference between the S1 and the S2.

In this way, the state of the load overcurrent protector is distinguished, and the method and apparatus for detecting have the same interfaces and output signal states for the positive and the negative systems, which have realized the compatibility of the positive and negative systems.

It needs to be illustrated that two detection lines of the input module 22 need to be connected to the two ends of the overcurrent protective device respectively, but the relative position of two detection signals is not limited.

Preferably, the device for detecting the state of the load overcurrent protector according to the embodiment of the present document can further include:

a high level signal generating module (not shown in the figure), configured to replace the high level signal gating module 24, receive the two output signals generated by the input module 22, and generate a high level signal according to the two output signals; and a low level signal generating module (not shown in the figure), configured to replace the low level signal gating module 26, receive the two output signals generated by the input module 22, and generate a low level signal according to the two output signals.

Here, the function executed by the high level signal generating module and the low level signal generating module is substantially same with the function executed by the high level signal gating unit 24 and the low level signal gating unit 26, except that the high level signal and the low level signal output by the high level signal generating module and the low level signal generating module are generated by themselves instead of gating, so the voltage values of the output high level signal and the low level signal can be changed flexibly, so as to adapt more situations. In the related art, there are many kinds of modules which can complete the above-mentioned functions. However, correspondingly, the complexity and cost of the circuit structure of the high level signal generating unit and the low level signal generating unit will be higher. In the specific implementation process, it can be considered whether to use the high level signal generating unit and the low level signal generating unit according to the actual conditions.

Figure 6:
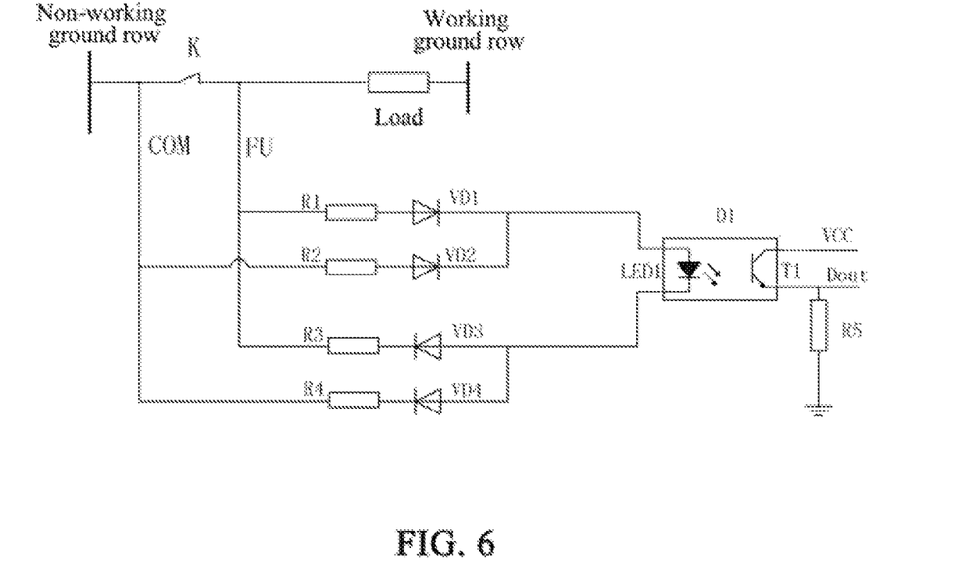
FIG. 6 is a structure schematic diagram of a first circuit of a device for detecting a state of a load overcurrent protector according to a preferable embodiment of the present document.

Preferably, as shown in FIG. 6, the high level signal gating module 24 and the low level signal gating module 26 can adopt the following circuit structure:

the high level signal gating module 24 includes a first branch and a second branch, wherein, the first branch includes a first resistance (R1) and a first diode (VD1), the first resistance (R1) is connected to one output end of the input module 22 (any one of the COM and the FU), and a positive pole of the first diode (VD1) is connected to the first resistance (R1) in series; the second branch includes a second resistance (R2) and a second diode (VD2), the second resistance (R2) is connected to another output end of the input module 22, and a positive pole of the second diode (VD2) is connected to the second resistance (R2) in series; and a negative pole of the first diode (VD1) and a negative pole of the second diode (VD2) are connected in parallel to one end of the detecting module 26; and the low level signal gating module 26 includes a third branch and a fourth branch, wherein, the third branch includes a third resistance (R3) and a third diode (VD3), the third resistance (R3) is connected to one output end of the input module 22 (any one of the COM and the FU), and a negative pole of the third diode (VD3) is connected to the third resistance (R3) in series; the fourth branch includes a fourth resistance (R4) and a fourth diode (VD4), the fourth resistance (R4) is connected to another output end of the input module 22, and a negative pole of the fourth diode (VD4) is connected to the fourth resistance (R4) in series; and a positive pole of the third diode (VD3) and a positive pole of the fourth diode (VD4) are connected in parallel to another end of the detecting module 26.

The above-mentioned circuit structure is only a typical structure, and all the circuits which can realize the gating function can be used here.

Figure 7:
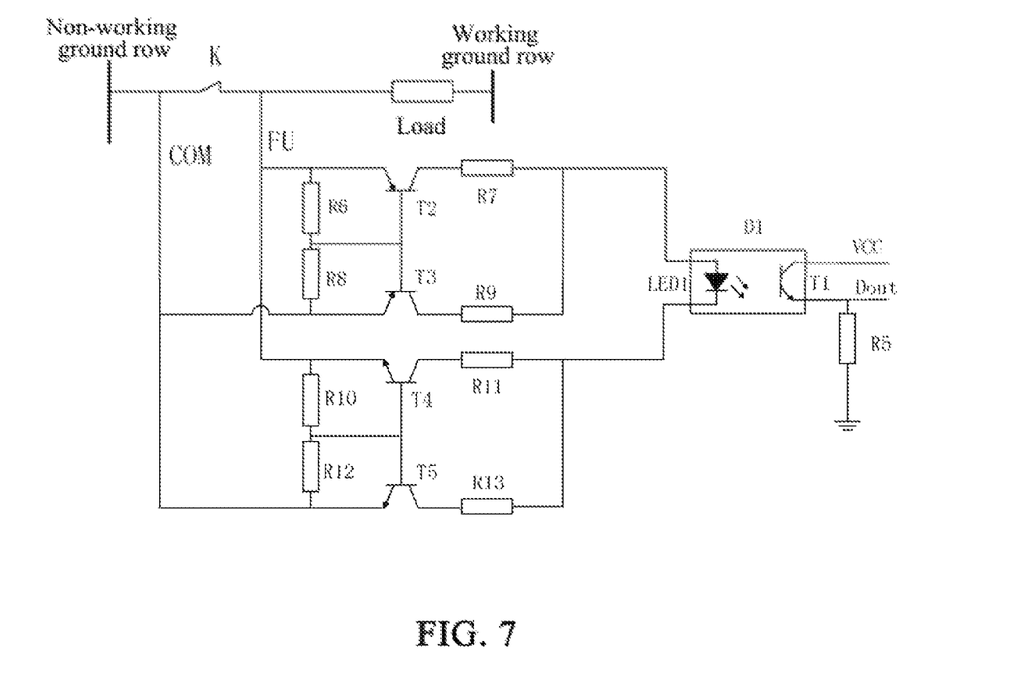
FIG. 7 is a structure schematic diagram of a second circuit of a device for detecting a state of a load overcurrent protector according to a preferable embodiment of the present document.

Preferably, as shown in FIG. 7, the high level signal gating unit 24 and the low level signal gating unit 26 can also adopt the following circuit structure:

the high level signal gating module 24 includes a first resistance (R6), a second resistance (R7), a third resistance (R8), a fourth resistance (R9), a first PNP triode (T2), and a second PNP triode (T3), the first resistance (R6) and the third resistance (R8) are connected to the two output ends of the input module 22 respectively, emitters of the first PNP triode (T2) and the second PNP triode (T3) are connected through the first resistance (R6) and the third resistance (R8), bases are connected directly and connected to the first resistance (R6) and the third resistance (R8), and collectors are connected to one end of the detecting module 28 through the second resistance (R7) and the fourth resistance (R9) respectively; and the low level signal gating module 26 includes a first resistance (R10), a second resistance (R11), a third resistance (R12), a fourth resistance (R13), a first NPN triode (T4), and a second NPN triode (T5), the first resistance (R10) and the third resistance (R12) are connected to the two output ends of the input module 22 respectively, emitters of the first NPN triode (T4) and the second NPN triode (T5) are connected through the first resistance (R10) and the third resistance (R12), bases are connected directly and connected to the first resistance (R10) and the third resistance (R12), and collectors are connected to another end of the detecting module 28 through the second resistance (R11) and the fourth resistance (R13) respectively.

Similar, the above-mentioned circuit structure is also only a typical structure, and all the circuits which can realize the gating function can be used here.

Figure 8:
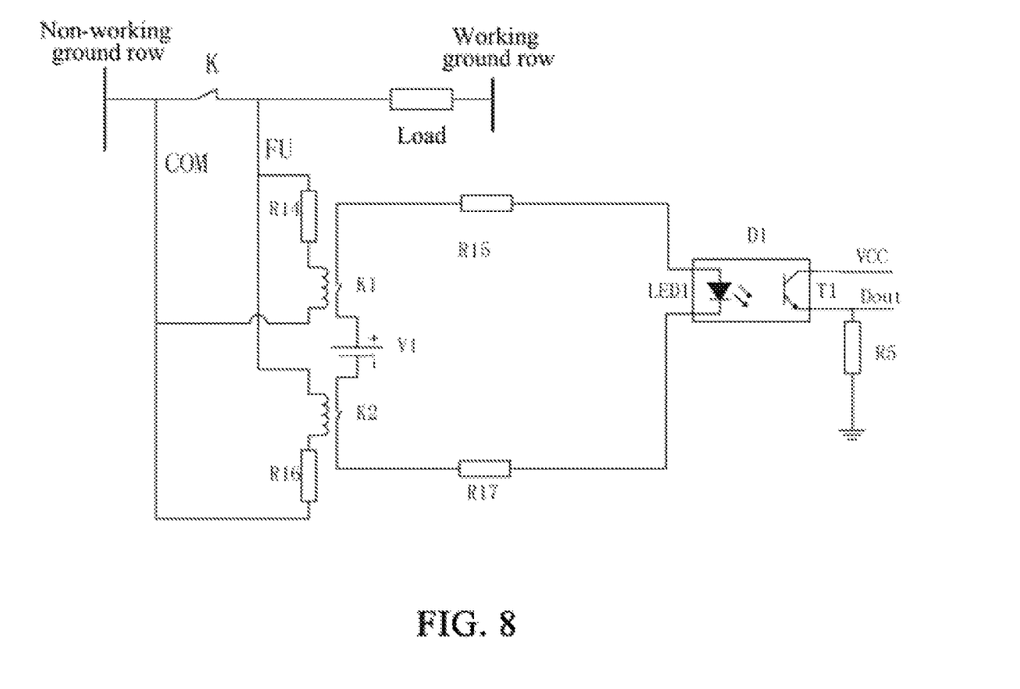
FIG. 8 is a structure schematic diagram of a third circuit of a device for detecting a state of a load overcurrent protector according to a preferable embodiment of the present document.

Preferably, as shown in FIG. 8, the high level signal generating unit and the low level signal generating unit can adopt the following circuit structure:

the high level signal generating module includes a first resistance (R14), a second resistance (R15), a relay (K1), and a power supply (V1), one end of the first resistance (R14) is connected to one output end of the input module 22, and another end is connected to the relay (K1); one end of the relay (K1) is connected to one end of the first resistance (R14), and another end is connected to another output end of the input module 22; and a positive pole of the power supply (V1) is connected to one end of the detecting module 28 through the relay (K1) and the second resistance (R15); and the low level signal generating module includes a first resistance (R16), a second resistance (R17), a relay (K2), and a power supply (V1), one end of the first resistance (R16) is connected to one output end of the input module 22, and another end is connected to the relay (K2); one end of the relay (K2) is connected to one end of the first resistance (R16), and another end is connected to another output end of the input module 22; and a negative pole of the power supply (V1) is connected to another end of the detecting module 28 through the relay (K2) and the second resistance (R17).

The above-mentioned circuit structure is also only a typical structure, and all similar circuits can be used here.

Preferably, as shown in FIG. 3, the detecting module 28 includes:

an analog-to-digital conversion unit 282, configured to, when there is a voltage difference between the above-mentioned high level signal and low level signal, output a first predetermined value to indicate that the state of the load overcurrent protector is abnormal, and when there is no voltage difference between the above-mentioned high level signal and low level signal, output a second predetermined value to indicate that the state of the load overcurrent protector is normal.

In the specific implementation process, the voltage difference between the above-mentioned high level signal and low level signal detected by the detecting module 28 can be analog-to-digital converted by an analog-to-digital conversion unit 282, to make the user be able to judge the working state of the load overcurrent protector more directly. For example, when the state of the load overcurrent protector is normal, that is, when there is no voltage difference between the S1 and the S2, a digital signal "0" is output; when the state of the load overcurrent protector is abnormal, that is, when there is a positive voltage difference between the S1 and the S2, a digital signal "1" is output.

Preferably, as shown in FIG. 6, the analog-to-digital conversion unit 282 can adopt the following circuit structure:

the analog-to-digital conversion unit 282 includes: a light emitting diode (LED1), a photosensitive triode (T1), and a resistance (R5), wherein, a positive pole of the light emitting diode (LED1) is connected to the output end of the high level signal (S1), a negative pole of the light emitting diode (LED1) is connected to the output end of the low level signal (S2), a base of the photosensitive triode (T1) is optically coupled with the light emitting diode LED1, a collector of the photosensitive triode (T1) is connected to a circuit power supply (VCC), an emitter of the photosensitive triode (T1) is grounded through the resistance (R5), and an output end Dout of the analog-to-digital conversion unit is led from the emitter of the photosensitive triode (T1).

The above-mentioned circuit structure is also a typical circuit structure, and all circuits which can realize the analog-to-digital conversion can be used here.

The above-mentioned preferable embodiments are illustrated in detail in combination with the examples and FIG. 6, FIG. 9 to FIG. 11. As shown in FIG. 6, the whole detection device of the load overcurrent protector is mainly composed of 4 rectifier diodes, VD1, VD2, VD3 and VD4, and 4 current limiting resistances, R1, R2, R3 and R4. Wherein, the VD1 and the VD2 are used for gating the high level signal, the VD3 and the VD4 are used for gating the low level signal, the current limiting resistances are used to detect the current limiting of the circuit; the analog-to-digital conversion unit is composed of an optocoupler (including a light emitting diode LED1 and a photosensitive triode T1) and the resistance R5, which converts the on-off state of the load overcurrent protector into the digital signal.

As shown in FIG. 6, when the state of the air switch or the load overcurrent protector is normal (keep conducting), those two signals FU and COM are connected together through the air switch or the fuse wire, the levels of the two are same, and now there is no voltage difference between the input signals of the D1, and the optocoupler D1 is not conducted.

Figure 9:
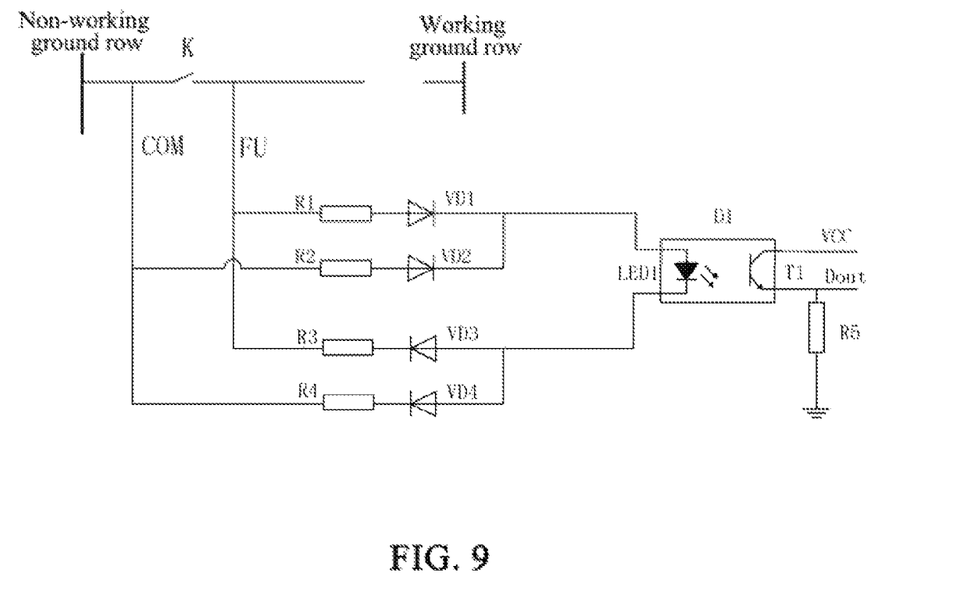
FIG. 9 is a schematic diagram of a detection principle when there is no load and the overcurrent protective device is disconnected according to an embodiment of the present document.

As shown in FIG. 9, when there is no load and the air switch or the load overcurrent protector is disconnected, the FU signal line is in a dangling state, the whole detection circuit is equivalent to only the COM signal being input and a loop can not be formed, so the optocoupler D1 is not conducted either.

Figure 10:
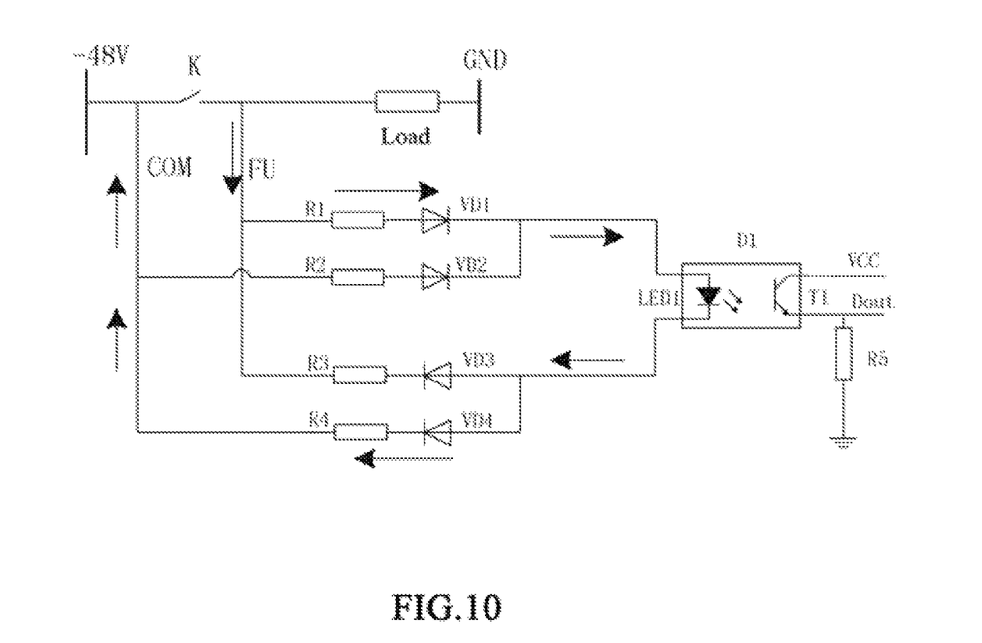
FIG. 10 is a schematic diagram of a detection principle when there is a load and the overcurrent protective device is disconnected in a −48V system according to an embodiment of the present document.
Figure 11:
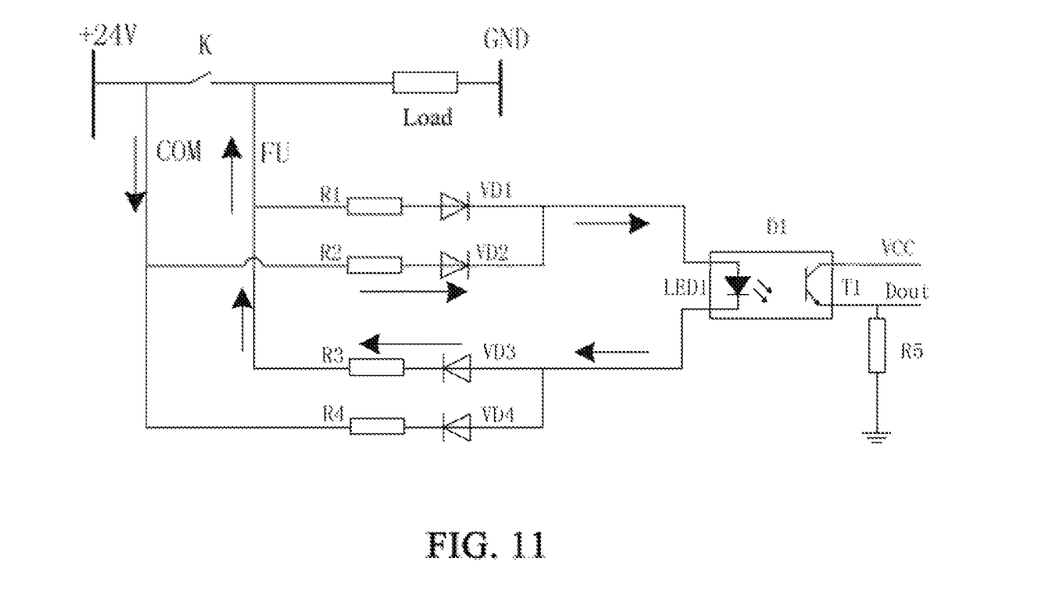
FIG. 11 is a schematic diagram of a detection principle when there is a load and the overcurrent protective device is disconnected in a +24V system according to an embodiment of the present document.

While when there is a load and the air switch or the load overcurrent protector is disconnected, it can be divided into two situations, the positive system and the negative system, to make analysis:

(1) in the negative system, as shown in FIG. 10, the FU signal is connected to the working ground row V+ through the load at this moment, the COM signal is connected to the V−, the level of the FU signal is higher than that of the COM signal; at this moment, the S1 signal is connected to the high level FU signal, and the S2 signal is connected to the low level COM signal; the circuit forms the loop through the working ground row V+-load-FU-R1-VD1-D1-VD4-R4-COM-V−, and the flow direction of the current is shown as the arrows in the figure, and the D1 optocoupler is conducted at this moment.

(2) In the positive system, as shown in FIG. 11, the FU signal is connected to the working ground row V− through the load at this moment, the COM signal is connected to the V+, the level of the COM signal is higher than that of the FU signal; at this moment, the S1 signal is connected to the high level COM signal, and the S2 signal is connected to the low level FU signal; the circuit forms the loop through the working ground row V+-COM-R2-VD2-D1-VD3-R2-FU-load-V−, and the flow direction of the current is shown as the arrows in the figure, and the D1 optocoupler is conducted too at this moment.

It can be seen that, in the normal state (the air switch or the load overcurrent protector is in the conducting state, and the air switch or the load overcurrent protector is in the disconnected state without a load), the optocoupler D1 is not conducted; while in the abnormal state (the air switch or the load overcurrent protector is in the disconnected state with a load), no matter in the positive system or the negative system, the optocoupler D1 is conducted. In this case, the normal state and the abnormal state can just be distinguished, and then the on-off state of the optocoupler is converted into the digital signal through the following analog-digital conversion part, then the working state of the load overcurrent protector can be judged visually.

Figure 12:
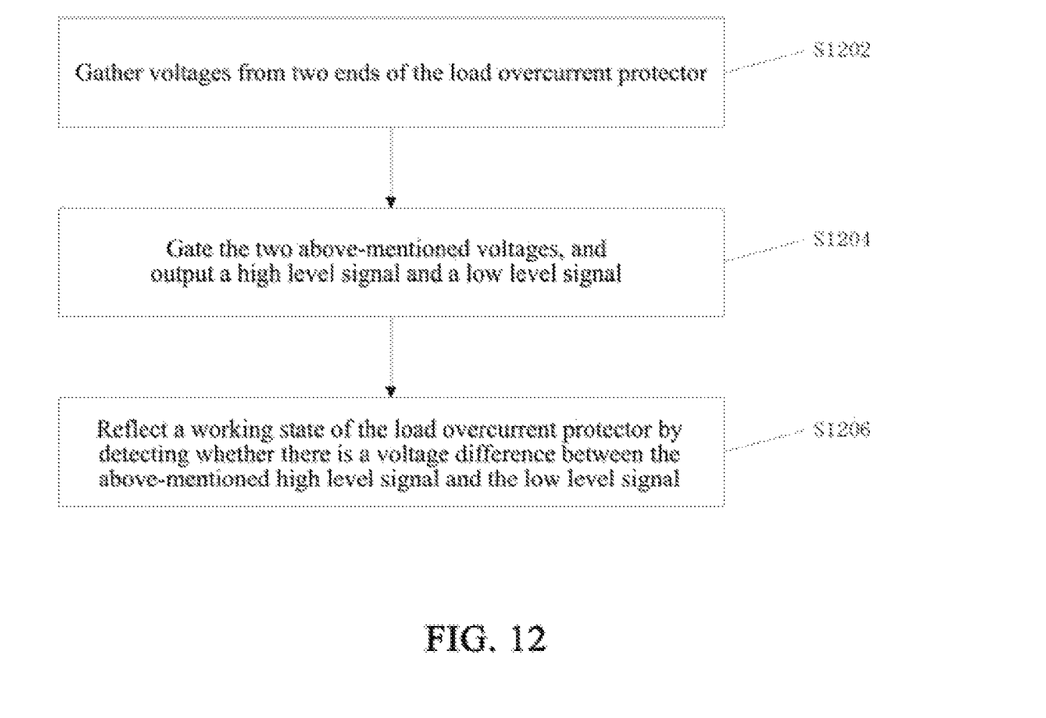
FIG. 12 is a flow chart of a method for detecting a state of a load overcurrent protector according to an embodiment of the present document.

FIG. 12 is a flow chart of a method for detecting a state of a load overcurrent protector according to an embodiment of the present document. As shown in FIG. 12, the method for detecting the state of the load overcurrent protector according to the embodiment of the present document includes the following steps:

in step S1202, gathering level signals from two ends of the load overcurrent protector, and obtaining two level signals;

in step S1204, gating the above-mentioned two level signals, and outputting a high level signal and a low level signal; and in step S1206, reflecting a working state of the load overcurrent protector by detecting whether there is a voltage difference between the high level signal and the low level signal.

Through the above-mentioned method, when detecting the state of the load overcurrent protector, and after the level signals of two ends of the load overcurrent protector are gathered, they also will be further gated, a high level signal and a low level signal are output, and the working state of the load overcurrent protector is indirectly reflected by detecting the voltage difference between the high level signal and the low level signal. The above-mentioned method can be fully compatible with the positive and negative system, and different working states of the load overcurrent protector can be distinguished without the software cooperation.

Preferably, the step S1204 also can be replaced by the following process:

generating a high level signal and a low level signal according to the gathered two level signals.

By generating a high level signal and a low level signal according to the gathered two level signals, the voltage difference can be controlled flexibly to adapt to various situations.

Preferably, the step S1206 can further include the following process: converting the voltage difference between the high level signal and the low level signal into a digital signal through the analog-to-digital conversion to be output, outputting a first predetermined value to indicate that the state of the load overcurrent protector is abnormal when there is a voltage difference, and outputting a second predetermined value to indicate that the state of the load overcurrent and protector is normal when there is no voltage difference.

In order to make the user be able to judge the working state of the load overcurrent protector more directly, the analog-to-digital conversion can be further performed on the voltage difference between the high level signal and the low level signal, for example, when the state of the load overcurrent protector is normal, a digital signal "0" is output; and when the state of the load overcurrent protector is abnormal, a digital signal "1" is output.

It can be seen from the above-mentioned description that, with the technical scheme provided by the present document, the state of the load overcurrent protective device can be detected, and the compatibility of the positive and negative system can be realized without making any change to the hardware and without requiring the software to participate, thus improving the adaptability and versatility of the present circuit device, which can increase the efficiency of the research and development, and also can reduce the administration expenses at the same time.

Obviously, it can be understood by those skilled in the art that each module or each step above-mentioned in the present document can be implemented by the universal calculating apparatus, and they can be integrated in a single calculating apparatus, or distributed in the network composed of a plurality of calculating apparatus. Alternatively, they can be implemented by program codes which can be executed by the calculating apparatus. Accordingly, they can be stored in the storage apparatus and implemented by the calculating apparatus, and in some situations, the illustrated or described steps can be executed by a different order, or they are made into each integrated circuit module respectively, or a plurality of modules or steps therein are made into the single integrated circuit module to implement. Thus, the present document is not limit to any specific combination of the hardware and software.

The above description is only the preferred embodiments of the present document and is not intended to limit the present document. For those skilled in the art, the present document can have various modifications and variations. All of modifications, equivalents and/or variations without departing from the spirit and essence of the present document should be embodied in the scope of the appending claims of the present document.

What is claimed is:

1. A device for detecting a state of a load overcurrent protector, comprising:
    an input module, configured to be connected with two ends of the load overcurrent protector, and generate two output signals respectively at two output ends thereof;
    a high level signal gating module, configured to receive the two output signals generated by the input module, and gate and output a high level signal according to the two output signals;
    a low level signal gating module, configured to receive the two output signals generated by the input module and gate and output a low level signal according to the two output signals; and
    a detecting module, configured to detect a voltage difference between the high level signal and the low level signal;
    a high level signal generating module, configured to replace the high level signal gating module, receive the two output signals generated by the input module, and generate a high level signal according to the two output signals; and
    a low level signal generating module, configured to replace the low level signal gating module, receive the two output signals generated by the input module, and generate a low level signal according to the two output signals;
    wherein when there is a voltage difference between said high level signal and said low level signal, it is reflected that the load overcurrent protector is in an abnormal state; when there is no voltage difference between said high level signal and said low level signal, it is reflected that the load overcurrent protector is in a normal state.

2. The device according to claim 1, wherein,
    the high level signal gating module comprises a first branch and a second branch, wherein, the first branch comprises a first resistance (R1) and a first diode (VD1), the first resistance (R1) is connected to one output end of the input module, and a positive pole of the first diode (VD1) is connected to the first resistance (R1) in series; the second branch comprises a second resistance (R2) and a second diode (VD2), the second resistance (R2) is connected to another output end of the input module, and a positive pole of the second diode (VD2) is connected to the second resistance (R2) in series; and a negative pole of the first diode (VD1) and a negative pole of the second diode (VD2) are connected in parallel to one end of the detecting module; and
    the low level signal gating module comprises a third branch and a fourth branch, wherein, the third branch comprises a third resistance (R3) and a third diode (VD3), the third resistance (R3) is connected to one output end of the input module, and a negative pole of the third diode (VD3) is connected to the third resistance (R3) in series; the fourth branch comprises a fourth resistance (R4) and a fourth diode (VD4), the fourth resistance (R4) is connected to another output end of the input module, and a negative pole of the fourth diode (VD4) is connected to the fourth resistance (R4) in series; and a positive pole of the third diode (VD3) and a positive pole of the fourth diode (VD4) are connected in parallel to another end of the detecting module.

3. The device according to claim 1, wherein,
    the high level signal gating module comprises a first resistance (R6), a second resistance (R7), a third resistance (R8), a fourth resistance (R9), a first PNP triode (T2), and a second PNP triode (T3), the first resistance (R6) and the third resistance (R8) are connected to the two output ends of the input module respectively, emitters of the first PNP triode (T2) and the second PNP triode (T3) are connected through the first resistance (R6) and the third resistance (R8), bases are connected directly and connected to the first resistance (R6) and the third resistance (R8), and collectors are connected to one end of the detecting module through the second resistance (R7) and the fourth resistance (R9) respectively; and
    the low level signal gating module comprises a first resistance (R10), a second resistance (R11), a third resistance (R12), a fourth resistance (R13), a first NPN triode (T4), and a second NPN triode (T5), the first resistance (R10) and the third resistance (R12) are connected to the two output ends of the input module respectively, emitters of the first NPN triode (T4) and the second NPN triode (T5) are connected through the first resistance (R10) and the third resistance (R12), bases are connected directly and connected to the first resistance (R10) and the third resistance (R12), and collectors are connected to another end of the detecting module through the second resistance (R11) and the fourth resistance (R13) respectively.

4. The device according to claim 1, wherein,
    the high level signal generating module comprises a first resistance (R14), a second resistance (R15), a relay (K1), and a power supply (V1), one end of the first resistance (R14) is connected to one output end of the input module, and another end is connected to the relay (K1); one end of the relay (K1) is connected to one end of the first resistance (R14), and another end is connected to another output end of the input module; and a positive pole of the power supply (V1) is connected to one end of the detecting module through a contactor of the relay (K1) and the second resistance (R15); and
    the low level signal generating module comprises a first resistance (R16), a second resistance (R17), a relay (K2), and a power supply (V1), one end of the first resistance (R16) is connected to one output end of the input module, and another end is connected to the relay (K2); one end of the relay (K2) is connected to one end of the first resistance (R16), and another end is connected to another output end of the input module; and a negative pole of power supply (V1) is connected to another end of the detecting module through a contactor of the relay (K2) and the second resistance (R17).

5. The device according to claim 1, wherein, the detecting module comprises:
    an analog-to-digital conversion unit, configured to, when there is a voltage difference between the high level signal and the low level signal, output a first predetermined value to indicate that the state of the load overcurrent protector is abnormal, and when there is no voltage difference between the high level signal and the low level signal, output a second predetermined value to indicate that the state of the load overcurrent protector is normal.

6. The device according to claim 5, wherein, the analog-to-digital conversion unit comprises: a light emitting diode (LED1), a photosensitive triode (T1), and a resistance (R5), wherein, a positive pole of the light emitting diode (LED1) is connected to an output end of the high level signal gating module or the high level signal generating module, a negative pole of the light emitting diode (LED1) is connected to an output end of the low level signal gating module or the low level signal generating module, a base of the photosensitive triode (T1) is optically coupled with the light emitting diode (LED1), a collector of the photosensitive triode (T1) is connected to a circuit power supply (VCC), an emitter of the photosensitive triode (T1) is grounded through the resistance (R5), and an output end of the analog-to-digital conversion unit is led from the emitter of the photosensitive triode (T1).

7. The device according to claim 1, wherein, the detecting module comprises:
an analog-to-digital conversion unit, configured to, when there is a voltage difference between the high level signal and the low level signal, output a first predetermined value to indicate that the state of the load overcurrent protector is abnormal, and when there is no voltage difference between the high level signal and the low level signal, output a second predetermined value to indicate that the state of the load overcurrent protector is normal.

8. A method for detecting a state of a load overcurrent protector, comprising:
gathering level signals from two ends of the load overcurrent protector, and obtaining two level signals;
gating the two level signals and outputting a high level signal and a low level signal; and
reflecting a working state of the load overcurrent protector by detecting whether there is a voltage difference between the high level signal and the low level signal;
wherein, the step of reflecting a working state of the load overcurrent protector by detecting whether there is a voltage difference between the high level signal and the low level signal comprises:
converting the voltage difference between the high level signal and the low level signal into a digital signal to be output through analog-to-digital conversion, outputting a first predetermined value to indicate that the state of the load overcurrent protector is abnormal when there is a voltage difference, and outputting a second predetermined value to indicate that the state of the load overcurrent and protector is normal when there is no voltage difference;
wherein when there is a voltage difference between said high level signal and said low level signal, it is reflected that the load overcurrent protector is in an abnormal state; when there is no voltage difference between said high level signal and said low level signal, it is reflected that the load overcurrent protector is in a normal state.

9. The method according to claim 8, wherein, a following step is used to replace the step of gating the two level signals and outputting a high level signal and a low level signal:
generating a high level signal and a low level signal according to the gathered two level signals.

* * * * *